United States Patent [19]

Grabbe et al.

[11] Patent Number: 4,927,369
[45] Date of Patent: May 22, 1990

[54] ELECTRICAL CONNECTOR FOR HIGH DENSITY USAGE

[75] Inventors: Dimitry G. Grabbe, Middletown; William J. Schnoor, Upper Strasburg, both of Pa.

[73] Assignee: AMP Incorporated, Harrisburg, Pa.

[21] Appl. No.: 314,346

[22] Filed: Feb. 22, 1989

[51] Int. Cl.$^5$ .......................................... H01R 23/72
[52] U.S. Cl. ........................................ 439/66; 439/82
[58] Field of Search .............. 439/69, 71, 66, 82, 439/74, 75, 862; 361/413

[56] References Cited

U.S. PATENT DOCUMENTS

| | | | |
|---|---|---|---|
| 4,482,937 | 11/1984 | Berg | 361/413 |
| 4,505,529 | 3/1985 | Barkus | 439/82 |
| 4,511,197 | 4/1985 | Grabbe et al. | 439/69 |
| 4,513,353 | 4/1985 | Bakermans et al. | 439/71 |
| 4,647,124 | 3/1987 | Kandybowski | 439/71 |
| 4,699,593 | 10/1987 | Grabbe et al. | 439/71 |

OTHER PUBLICATIONS

Plated Through-Hole Contact, Schick, IBM Disclosure Bulletin, vol. 6, No. 10, Mar. 1964.

*Primary Examiner*—William Briggs
*Attorney, Agent, or Firm*—James M. Trygg

[57] ABSTRACT

An electrical connector (20) for interposition between an electronic component (2) and a printed circuit card (14), electrically to connect contact pads (10) of the electronic component (2) to contact pads (18) of the circuit card (14), comprises a pair of superposed insulating plates (22 and 24) connected together by means of interengaging pins and sockets (66, 70 and 68, 72). The insulating plates (22 and 24) cooperate to define cavities (30) receiving spring contact elements (40) each having a nose (50) projecting through an opening (36) in a respective outer surface (26 or 28) of the plates (22 and 24) for engagement with the contact pads (10 and 18). One half of each cavity (30) is defined by one of the plates (22 and 24) the other half being defined by the other of the plates (22 and 24). The cavities (30) have end walls (62 and 64) between which the contact elements (40) are compressed by engagement with the pads (10) and (18) so that the noses (50) wipe the contact surfaces of the pads (10 and 18).

9 Claims, 5 Drawing Sheets

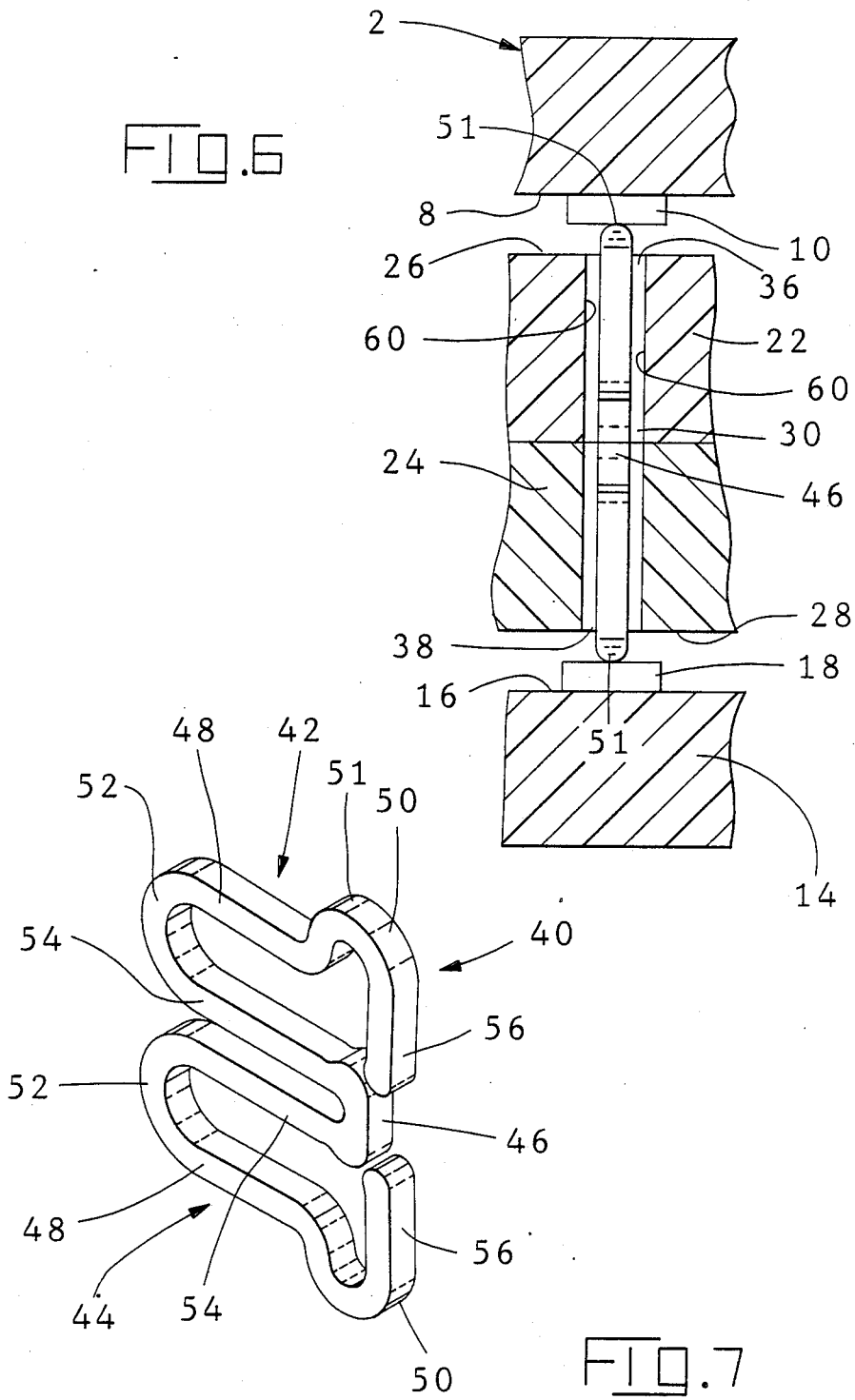

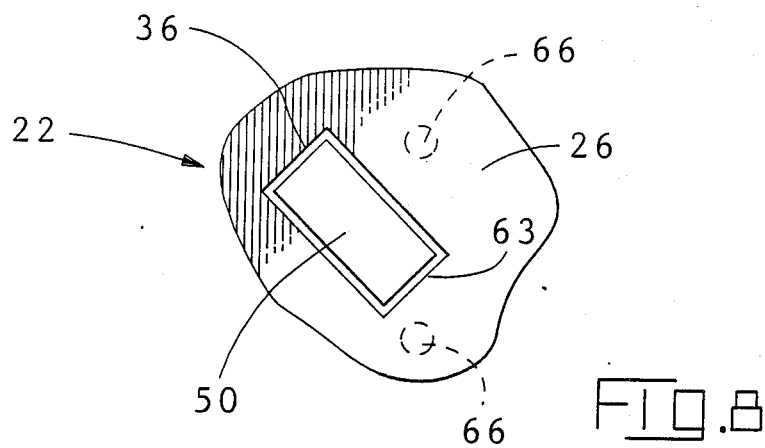
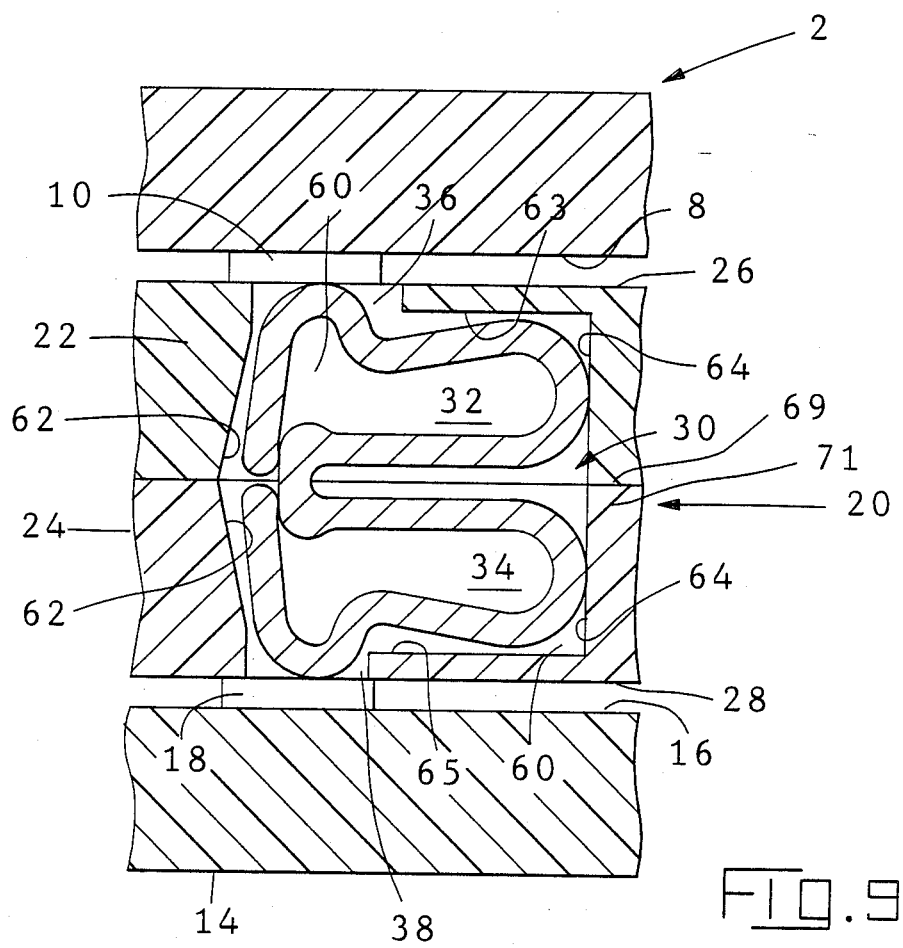

ELECTRICAL CONNECTOR FOR HIGH DENSITY USAGE

This invention relates to an electrical connector for high density usage, and in particular, for connecting a multiplicity of contact pads of an electronic component, arranged in a grid array, to corresponding pads of a printed circuit card. The grid array may comprise, for example, twenty five rows of twenty five pads each, with a center to center spacing of 0.060 inches.

BACKGROUND OF THE INVENTION

One way of electrically connecting the pads of an electronic component having closely spaced contact pads, to the pads of a circuit card, is to braze to each pad of the electronic component, the head of an electrical pin, using a gold alloy. The pins are then inserted into plated through holes in the circuit card and soldered to the plating of the holes. Alternatively the pins may be inserted into sockets which have been soldered into plated through holes in the circuit card. In the first case, it is inconvenient to remove the electronic component from the circuit card for diagnosis or replacement, and in the second case it is expensive to provide the sockets, which may be low insertion force sockets or zero insertion force sockets, and economy of space is not achieved. In any event, the brazing of the pins to the contact pads of the electronic component is both time consuming and expensive.

Another expedient, is to interpose between the electronic component and the circuit card, an electrical connector consisting of a glass-ceramic substrate with small cylindrical holes positioned in accordance with the grid array, each hole being stuffed with fine gold or gold-plated wires forming a resilient mesh which is known in the art as a "fuz button". Fuz buttons are expensive to provide in view of the amount of gold that must be used, and their construction is labor intensive. Also, such fuz buttons afford but low contact force and have no capability of wiping the pads that they are to connect, upon their engagement therewith.

There are disclosed in U.S. Pat. No. 4,511,197, U.S. Pat. No. 4,513,353, U.S. Pat. No. 4,647,124 and U.S. Pat. No. 4,699,593, electrical connectors of the type known as "interposer" connectors, such connectors comprising an insulating structure having cavities therein receiving electrical contact elements with contact noses each projecting from opposite interface surfaces of the structure. Such a connector is for interposition between an electronic component and a printed circuit card, so that each contact nose of each contact element engages with a respective pad of the electronic component and a respective pad of the circuit card. According to U.S. Pat. No. 4,513,353 the contact elements are retained in their cavities, by means of a contact retainer secured in position against the insulating structure, by means of a metal clamp. A similar means for retaining the contact elements in their cavities, being employed according to the teaching of U.S. Pat. No. 4,511,197 and U.S. Pat. No. 4,647,124 which teach that the contact elements are retained in their cavities by means of ears which project laterally from each contact element and are received in slots defined by L-shaped posts in the cavities, and by adjacent walls thereof. According to U.S. Pat. No. 4,699,593, the contact elements are inserted into slots formed in modules which are subsequently inserted into openings in a frame to retain the contact elements in their slots. None of these connectors is designed for use with an electronic component having contact pads distributed over its whole interface surface in a grid array.

SUMMARY OF THE INVENTION

This present invention is intended to provide a simplified form of interposer connector for use with an electronic component, the contact pads of which are arranged in a high density grid array which will usually be a rectangular grid array.

To this end, the connector comprises a pair of superposed insulating plates which are connected by means, for example, in the form of pins and sockets with which the plates are formed, the plates being recessed so as to cooperate to define cavities receiving contact elements having contact noses projecting from opposite outer, interface surfaces of the two plates, for engagement with respective contact pads on an interface surface of the electronic component and respective contact pads on an interface surface of the circuit card, when the connector has been interposed between the component and card. The contact elements are assembled to the connector by inserting them into the recesses defined by one of the plates, and the other plate is then connected thereto, so that the contact elements are retained in their cavities. The plates may serve partially to compress the contact elements so as to preload them.

In the interest of contact density, pins and sockets of small cross sectional area may connect the plates, between the cavities containing the contact elements, the plates being connected at outer margins thereof by pins and sockets of much larger cross sectional area.

Preferably, the recesses of one plate are of the same configuration and dimensions as those of the other plate but are arranged in mirror image symmetry with respect thereto.

Each cavity may have opposite cavity end walls which are arranged to compress the contact element in the cavity, between them, when the contact noses of the contact element are engaged with respective pads on the electronic component and on the circuit card, to cause the noses to wipe against the contact pads. To this end, one end wall may define a pair of cam surfaces which diverge towards the contact element in the cavity, to urge it against the other end wall of the cavity, upon the noses being engaged with the pads. Each contact element may comprise a pair of loop shaped contact springs arranged in mirror image symmetry according to the teaching of U.S. Pat. No. 4,699,593, each contact spring having a spring arm presenting a respective contact nose of the contact element and being connected to the other contact spring by way of a bight which is convex towards the other end wall, the spring arms being engagable with respective ones of the cam surfaces upon the contact noses being engaged by the pads.

In the interest of contact density, the spring arms may be angled with respect to both X and Y axes of the grid array, for example by 30° with respect to one of those axes.

BRIEF DESCRIPTION OF THE DRAWINGS

FIG. 6 is a view taken on the lines 6—6 of FIG. 5;

FIG. 7 is an isometric view of an electrical contact element of the connector;

FIG. 8 is an enlarged fragmentary view illustrating a detail of FIG. 3; and

FIG. 9 is fragmentary view illustrating a contact element of the connector after the electronic component has been pressed down thereagainst.

DETAILED DESCRIPTION OF THE INVENTION

Figure 1:
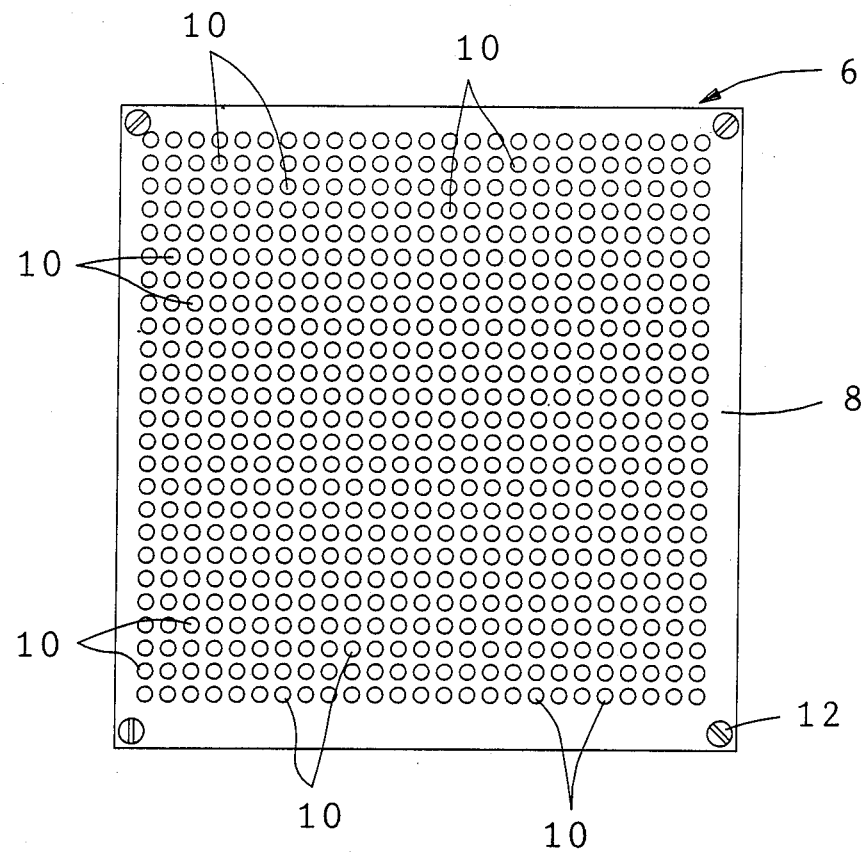
FIG. 1 is underplan view of a substrate of an electronic component.
Figure 2:
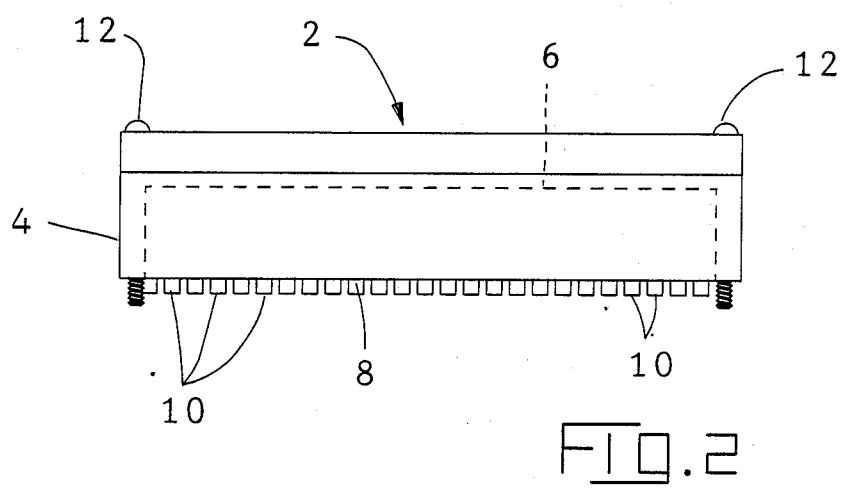
FIG. 2 is side view of the electronic component.
Figure 5:
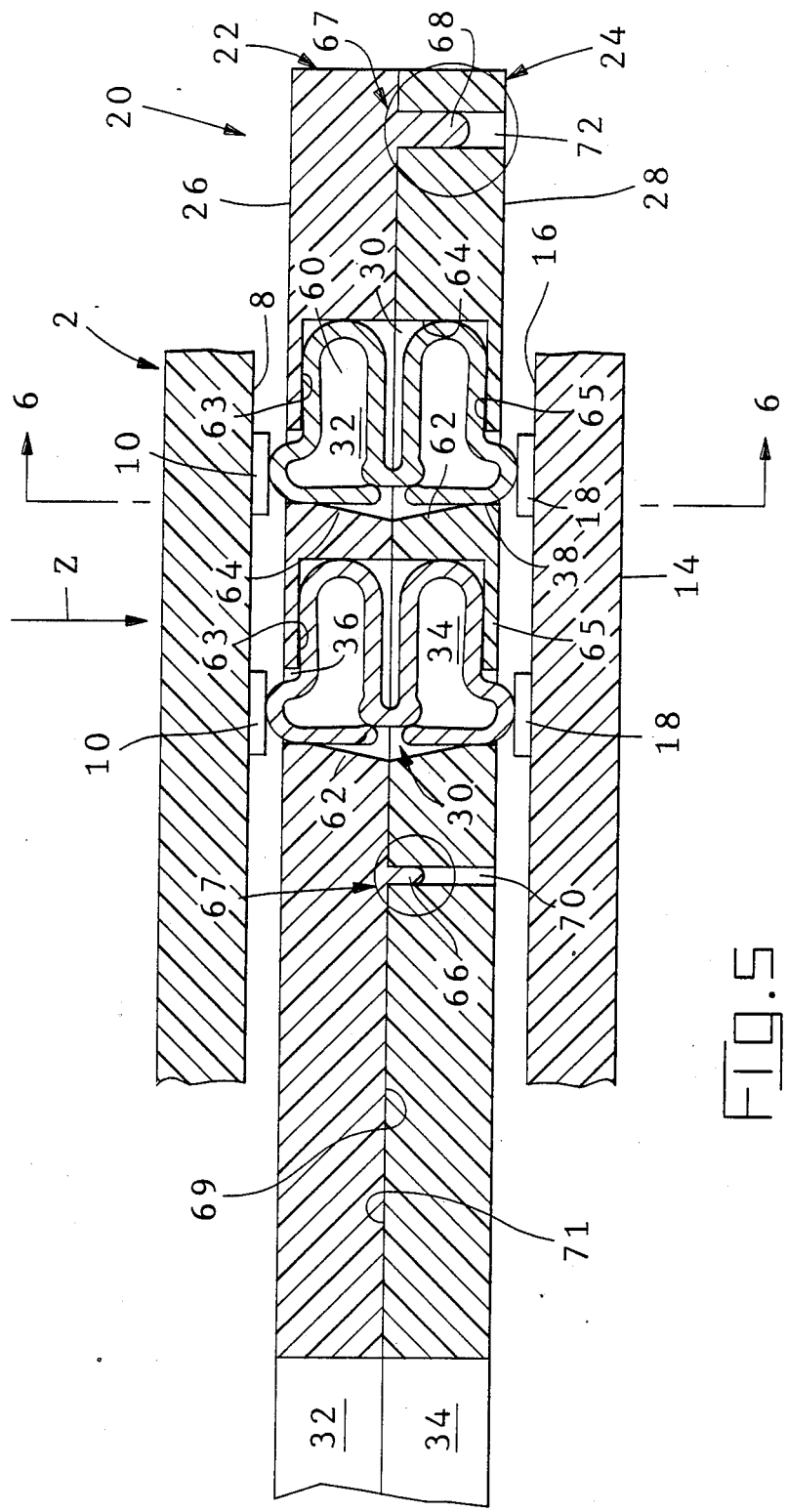
FIG. 5 is an enlarged view taken on the lines 5—5 of FIG. 3 showing the connector interposed between the electronic component and the circuit card, prior to the electronic component being pressed down against the connector.

As shown in FIGS. 1 and 2, an electronic component 2 comprises a frame 4 supporting a substrate 6. The substrate 6 contains a number of layers of interconnection from a semiconductor chip (not shown) in the center of the substrate 6 and from which leads (not shown) emanate radially in different directions and are fed through a bottom, interface, surface 8 of the substrate 6 and are there terminated to circular contact pads 10 arranged in grid array. The frame 4 has at each corner a fastener 12 for mounting the component 2 to a printed circuit card 14, as shown in FIGS. 5, 6 and 9. On an upper interface surface 16, circular contact pads 18 are disposed of the same number and grid array as the contact pads 10 on the surface 8 of the substrate 6. The pads 18 are connected to printed circuitry (not shown) on the card 14.

Figure 3:
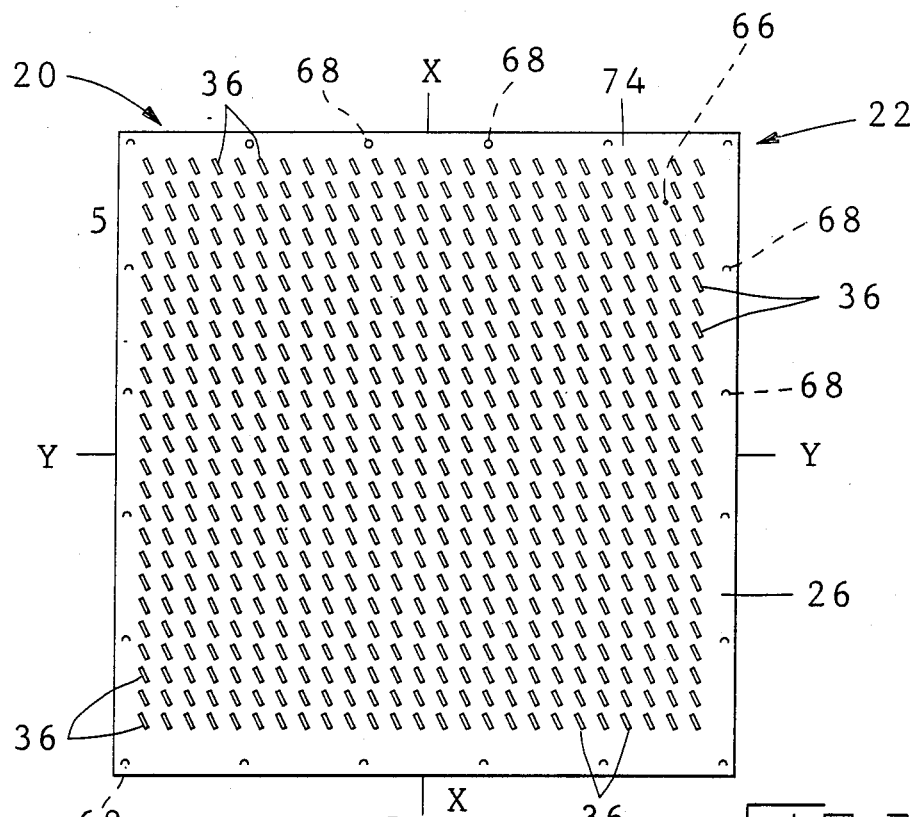
FIG. 3 is a top plan view of an interposer electrical connector for electrically connecting respective contact pads of the electronic component to respective contact pads on a printed circuit card, the connector comprising superposed top and bottom insulating plates.
Figure 4:
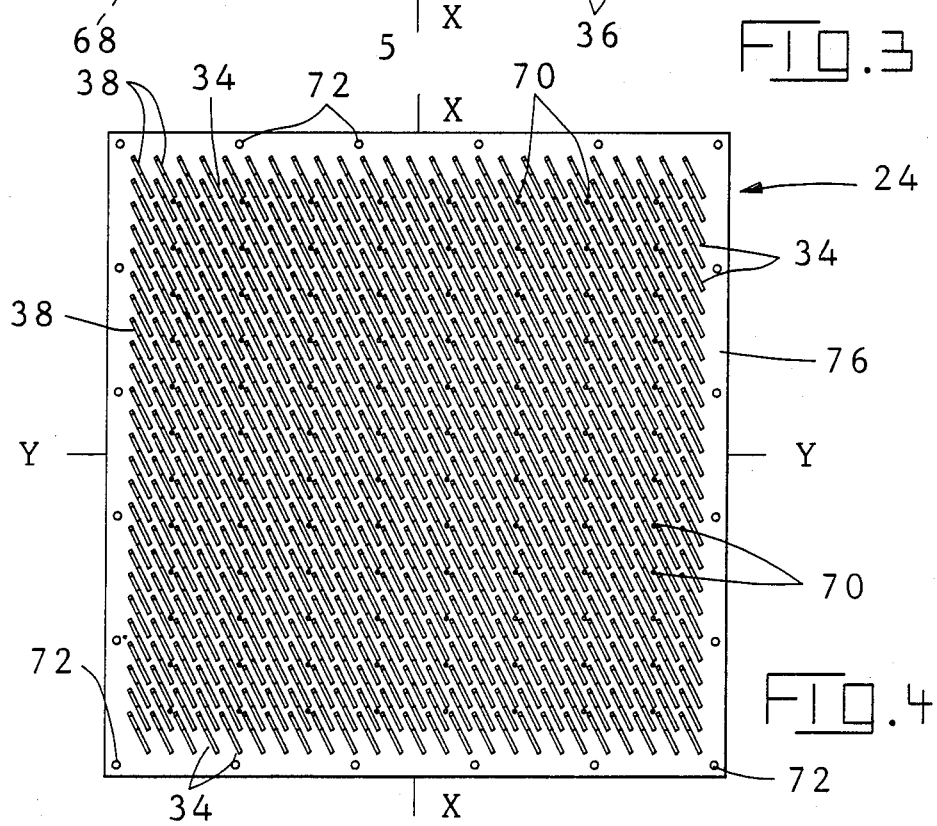
FIG. 4 is a top plan view showing the bottom insulating plate.

An interposer electrical connector 20, for connecting respective pads 10 of the component 2, to respective pads 18 of the card 14, comprises upper and lower, superposed insulating plates 22 and 24, respectively, the plate 22 having an upper interface surface 26 and the plate 24 having a lower interface surface 28. The surfaces 26 and 28 being of the same size and shape as the surface 8 of the component 2. The plates 22 and 24 cooperate to define slot-shaped, electrical contact element receiving, cavities 30, as best seen in FIGS. 5 and 9, each comprising a cavity half portion 32 in the form of recess defined by the plate 22 and a cavity half portion 34 in the form of a recess defined by the plate 24. The cavity portions 32 each communicate with an opening 36 in the interface surface 26, each cavity portion 34 communicating with an opening 38 in the interface surface 28. Each cavity portion 32 and 34 is of identical size and configuration, the portions 32 and 34 of each pair being arranged in mirror image symmetry. There is disposed in each cavity 30, a stamped metal electrical contact element 40 comprising a pair of identical, loop-shaped contact springs 42 and 44 arranged in mirror image symmetry and being connected by a bight 46. Each contact spring 42 and 44 comprises spring arm 48, presenting at one end a contact nose 50 and being connected at its other end, by way of a bight 52 and an inner arm 54, to the bight 46 and thus to the other contact spring. The nose 50 includes a contacting surface 51 which may be relatively flat as shown in FIG. 7, or arcuate as shown in FIG. 6. Each nose 50 has an extension 56 directed towards the bight 46. The noses 50 are arranged in the same grid array as the contact pads 10 and 18. Contact elements identical with the contact elements 40 are described in detail in U.S. Pat. No. 4,699,593 which is incorporated herein by reference. Each cavity 30 is defined by opposed side walls 60 best seen in FIG. 6, opposed end walls 62 and 64, respectively, and top and bottom walls 63 and 65, respectively, in which the openings 36 and 38, respectively, are formed. Each cavity 30 is elongate in a direction parallel to the surfaces 26 and 28. The end walls 62 of each cavity 30 present inclined cam surfaces which are divergent in the direction of the contact element 40 in the cavity 30, the end walls 64 and the side walls 60 extending normally of the surfaces 26 and 28. The spring arm 48 of each contact spring 42 and 44 is also elongate in a direction parallel to the surfaces 26 and 28 It will be apparent from FIGS. 3, 4, and 8, that the cavities 30 are so oriented, in the interest of maximum contact density, that the arms 48 extend at an angle of approximately 30° with respect to the X axis of the grid array and approximately 60° with respect to its Y axis.

Connecting means 67 retaining the plates 22 and 24 in their superposed relationship, with inner surfaces 69 and 71 of the plates 22 and 24 in contiguous relationship, comprise first pins 66 and second pins 68, which are formed integrally with the plate 22, the pins 66 and 68, being snugly received in sockets 70 and 72, respectively, formed in the plate 24. The pins and sockets 66 and 70, which are of smaller cross sectional area than the pins and sockets 68 and 72 are distributed between the cavities 30 within peripheral margins 74 and 76 (FIGS. 3 and 4) of the plates 22 and 24, respectively, the pins and sockets 68 and 72 being provided in the margins 74 and 76 respectively about the periphery the grid array of cavities 30. Alternatively, both of the plates 22 and 24 could be provided with both pins and sockets, the plates 22 and 24 thus being mirror images of each other. This may be accomplished by alternating pins 66 and holes 70 and alternating pins 68 and holes 72 in a pair of the plates 22 or 24. Then by simply rotating one of the pair of plates 180 degrees and superimposing the plates as shown in FIG. 5, the holes of each plate would be in engaging alignment with the pins of the other.

In order to assemble the connector 20, starting with the plates 22 and 24 detached from one another, the contact elements 40 are inserted into the cavity portions 34 of the plate 24 and the plate 22 is then squeezed down on the plate 24 so that each pin 66 and 68 is forced into its respective socket 70 and 72 respectively, the spring arms 48 of the contact elements 42 being compressed slightly, between the walls 63 and 65, so as to be to some extent preloaded. The connector 20 when so assembled is then interposed between the interface surface 8 of the electronic component 2 and the interface 16 of the circuit card 14, as shown in FIG. 5 so that each pad 10 of the component 2 and each pad 18 of the circuit card 4 is aligned with a respective nose 50 of a respective contact element 40. The component 2 is then secured to the circuit card 14 by means of the fasteners 12, being pressed down along a Z axis on the connector 20, so that pads 10 and 18 are driven against the respective noses 50 thereby forcing the contact spring arms of each contact element 42, 44 resiliently towards each other as shown in FIG. 9 so that the junction between each nose 50 and the extension 56 thereof engages with the cam surface of a respective end wall 62. The bight 52 of each contact spring 42 and 44 is thus forced against the opposite wall 64, the wall 64 providing a reference, or a reaction surface so that each nose 50 is forced to rotate through a small angle, as the component 2 is pressed down, whereby that nose 50 wipes the engaging surface of the respective pad 10 or 18, as the case may be. Any slight contamination that may be on the engaging surfaces of the pads, will accordingly be disrupted, so that excellent electrical contact is achieved between the pads 10 and 18 and the noses 50. The spring arms 48 of each contact element 40 are moved towards one another so that the extensions 56 thereof make electrically conductive contact with the bight 46 thereof to provide an electrical path of minimal length between the pads 10 and pad 18.

Preferably, each nose 50 projects by 0.010 inches (0.0254 cm) from the connector 20, thus providing a total travel of 0.020 inches (0.0508 cm) for noses of each contact element 40, as the component 2 and the connector 20 are moved from their FIG. 5 to their FIG. 9 relative positions.

The pads 10 may be of 0.04 inches (0.01016 cm) in diameter, the pads 18 being of even small diameter. Each array of pads may comprise twenty five rows of twenty five pads each, as shown in FIG. 1. The pads may be on centers of 0.060 inches (0.1524 cm), 0.075 inches (0.1905 cm) or 0.100 inches (0.254 cm) for example. These high contact densities are achievable by virtue of arrangement and construction of the connector 20 as described above. The plates 22 and 24 can each conveniently be molded in one piece.

What is claimed is:

1. An electrical connector for interposition between first and second opposing surfaces each having thereon a multiplicity of contact pads arranged in a predetermined grid array, electrically to connect each pad on said first surface with a respective pad on said second surface, the connector comprising;
   a pair of insulating plates arranged in parallel, superposed relationship, said plates presenting third and fourth opposed outer surfaces and each plate being formed with a multiplicity of recesses arranged in said predetermined grid array, each recess of one plate being aligned with a respective recess of the other plate to define a contact element receiving cavity;
   connecting means formed integral with said plates and connecting said plates together in said superposed relationship comprising first interengaging pins and sockets connecting outer margins of said plates, and second interengaging pins and sockets connecting said plates at positions between said cavities, the first pins and sockets being of substantially greater cross sectional area than the second pins and sockets; and
   a multiplicity of contact elements each retained by said plates in a respective one of said cavities and each having a pair of opposed contact noses one of which protrudes through an opening in said third outer surface, for resilient engagement with a respective contact pad on said first opposing surface and the other of which protrudes through an opening in said fourth outer surface for resilient engagement with a respective contact pad on said second opposing surface.

2. An electrical connector for interposition between first and second opposing surfaces each having thereon a multiplicity of contact pads arranged in a predetermined grid array, electrically to connect each pad on said first surface with a respective pad on said second surface, the connector comprising;
   a pair of insulating plates arranged in parallel, superposed relationship, said pales presenting third and fourth opposed outer surfaces and each plate being formed with a multiplicity of recesses arranged in said predetermined grid array, each recess of one plate being aligned with a respective recess of the other plate to define a contact element receiving cavity wherein each cavity has first and second opposite cavity end walls shaped for compressing the contact element in the cavity between them when said contact noses of the contact element in said cavity are engaged with said contact pads, to cause said noses to wipe thereagainst;
   connecting means formed integral with said plates and connecting said plates together in said superposed relationship; and
   a multiplicity of contact elements each retained by said plates in a respective one of said cavities and each having a pair of opposed contact noses one of which protrudes through an opening in said third outer surface, for resilient engagement with a respective contact pad on said first opposing surface and the other of which protrudes through an opening in said fourth outer surface for resilient engagement with a respective contact pad on said second opposing surface.

3. A connector as claimed in claim 2, wherein said first cavity end wall defines a pair of cam surfaces which diverge towards the contact element in the cavity, for urging said contact element against said second cavity end wall.

4. A connector as claimed in claim 3, wherein said contact element comprises a pair of contact springs arranged in mirror image symmetry, each contact spring having a spring arm presenting a respective one of said contact noses of said contact element and being connected to the other contact spring by way of a bright which is engagable with respective ones of said cam surfaces to urge said bights against said second cavity wall, thereby to cause rotational movement of said contact noses upon said contact noses being engaged with said pads.

5. A connector as claimed in claim 1, wherein each said contact element comprises a pair of oppositely positioned spring arms each presenting a respective contact nose of said contact element, each contact receiving cavity having top and bottom cavity walls each preloading a respective one of the spring arms.

6. An electrical connector for interposition between first and second opposing surfaces each having thereon a multiplicity of contact pads arranged in a predetermined grid array having X and Y axes extending normally of each other, electrically to connect each pad on said first surface with a respective pad on said second surface, the connector comprising;
   a pair of insulating plates arranged in parallel, superposed relationship, said plates presenting third and fourth opposed outer surfaces and each plate being formed with a multiplicity of recesses arranged in said predetermined grid array, each recess of one plate being aligned with a respective recess of the other plate to define a contact element receiving cavity, each cavity being elongate in a direction parallel to said third and fourth outer surfaces and being angled with respect to said X and Y axes;

connecting means formed integral with said plates and connecting said plates together in said superposed relationship; and a multiplicity of contact elements each retained by said plates in a respective one of said cavities and each having a pair of opposed contact noses one of which protrudes through an opening in said third outer surface, for resilient engagement with a respective contact pad on said first opposing surface and the other of which protrudes through an opening in said fourth outer surface for resilient engagement with a respective contact pad on said second opposing surface.

7. An electrical connector for interposition between first and second opposing surfaces each having thereon a multiplicity of contact pads arranged in a predetermined grid array, electrically to connect each pad on said first surface with a respective pad on said second surface, the connector comprising;

a pair of insulating plates arranged in a parallel, superposed relationship, said plates presenting third and fourth opposed outer surfaces and each plate being formed with a multiplicity of recesses arranged in said predetermined grid array, each recess of one plate being aligned with a respective recess of the other plate to define a contact element receiving cavity;

connecting means formed integral with said plates and connecting said plates together in said superposed relationship; and a multiplicity of contact elements each retained by said plates in a respective one of said cavities and each having a pair of opposed contact noses one of which protrudes through an opening in said third outer surface, for resilient engagement with a respective contact pad on said first opposing surface and the other of which protrudes through an opening in said fourth outer surface for resilient engagement with a respective contact pad on said second opposing surface, each said contact element comprising a pair of oppositely positioned spring arms each presenting a respective contact nose of said contact element, wherein said grid array has X and Y axes extending normally of each other, and each spring arm is angled by approximately 30° with respect to one of said X and Y axes and by approximately 60° with respect to the other of those axes.

8. An electrical connector assembly comprising an electronic component in the form of a first substrate containing a semiconductor chip having a first opposing surface upon which a multiplicity of first contact pads are arranged in a predetermined grid array, some of said pads being electrically connected to said chip;

a pair of insulating plates connected together in parallel superposed relationship by means of interengaging pins and sockets acting between confronting inner surfaces of said plates, said plates having recess cooperating to define a multiplicity of cavities arranged in said grid array and some of said cavities each contained an electrical contact element having a pair of contact noses each projecting from a respective one of second and third outer surfaces of said plates; and a printed circuit card having a fourth opposing surface from which project a multiplicity of second contact pads arranged in said predetermined grid array, and being connected to electrical circuitry of said car, each first contact pad being engaged with a respective nose projecting from said second interface surface and each second contact pad being engaged with a respective nose projecting from said third interface surface, said electronic component, said plates and said circuit card being secured together, so that each first contact pad is securely electrically connected to a respective second contact pad wherein said grid array is rectangular, having X and Y axes extending at right angles to each other, the said cavities and said contact elements being elongate in a direction parallel to said interface surfaces and being angles with respect to said X and Y axes.

9. An assembly as claimed in claim 8, wherein said grid array is rectangular, having X and Y axes extending at right angles to each other, the said cavities and said contact elements being elongate in a direction parallel to said interface surfaces and being angled with respect to said X and Y axes.

* * * * *

UNITED STATES PATENT OFFICE
CERTIFICATE OF CORRECTION

Patent No. 4,927,369     Dated  May 22, 1990

Inventor(s)  Dimitry G. Grabbe and William J. Schnoor

It is certified that error appears in the above-identified patent and that said Letters Patent is hereby corrected as shown below:

In claim 4, column 6, line 40, the word "bright" should be --bight--.

In claim 4, column 6, line 40, after the words "which is" add --convex towards said cavity wall, said spring arms being--.

In claim 8, column 8, line 14, the word "recess" should be --recesses--.

In claim 8, column 8, line 24, the word "car" should be --card--.

In claim 8, column 8, line 37, the word "angles" should be --angled--.

Signed and Sealed this

Tenth Day of December, 1991

Attest:

HARRY F. MANBECK, JR.

*Attesting Officer*     *Commissioner of Patents and Trademarks*